United States Patent
Kim

(10) Patent No.: US 7,601,622 B2
(45) Date of Patent: Oct. 13, 2009

(54) METHOD OF FORMING FINE PATTERNS IN SEMICONDUCTOR DEVICE AND METHOD OF FORMING GATE USING THE SAME

(75) Inventor: Ki Yong Kim, Buchun-shi (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,901

(22) Filed: Dec. 30, 2005

(65) Prior Publication Data

US 2006/0148226 A1 Jul. 6, 2006

(30) Foreign Application Priority Data

Dec. 31, 2004 (KR) .................. 10-2004-0118294

(51) Int. Cl.
*H01L 21/3205* (2006.01)
(52) U.S. Cl. ............... 438/587; 438/585; 257/E21.598
(58) Field of Classification Search ........... 438/585, 438/697, 587, 595
See application file for complete search history.

(56) References Cited

U.S. PATENT DOCUMENTS

| 4,776,922 | A | * | 10/1988 | Bhattacharyya et al. ..... 438/696 |
| 4,784,718 | A | * | 11/1988 | Mitani et al. ................. 438/183 |
| 5,786,256 | A | * | 7/1998 | Gardner et al. .............. 438/305 |
| 6,255,202 | B1 | * | 7/2001 | Lyons et al. ................. 438/585 |
| 6,383,952 | B1 | * | 5/2002 | Subramanian et al. ...... 438/781 |
| 6,664,154 | B1 | * | 12/2003 | Bell et al. ................... 438/197 |
| 2004/0198031 | A1 | * | 10/2004 | Lin et al. .................... 438/585 |

* cited by examiner

*Primary Examiner*—Alexander G Ghyka
*Assistant Examiner*—Reema Patel
(74) *Attorney, Agent, or Firm*—Finnegan, Henderson, Farabow, Garrett & Dunner, L.L.P.

(57) ABSTRACT

There are provided a method of forming fine patterns in a semiconductor device, and a method of forming a gate with a fine critical dimension using the same. In the method of forming fine patterns in a semiconductor device, a plurality of sidewall buffer patterns are formed on a gate insulating layer formed on a substrate, wherein the plurality of the sidewall buffer patterns are spaced apart from each other by a predetermined distance. A sidewall layer is deposited on the sidewall buffer patterns as well as the gate insulating layer. The sidewall layer is etched such that sidewall patterns remain on sidewalls of the sidewall buffer patterns.

10 Claims, 3 Drawing Sheets

METHOD OF FORMING FINE PATTERNS IN SEMICONDUCTOR DEVICE AND METHOD OF FORMING GATE USING THE SAME

BACKGROUND OF THE INVENTION

1. Field of the Invention

The present invention relates to a semiconductor device, and more particularly, to a method of forming fine patterns in a semiconductor device and a method of forming a gate using the same.

2. Description of the Related Art

FIG. 1 is a cross-sectional view illustrating a related art method of forming a gate in a semiconductor device.

To begin with, referring to FIG. 1, a gate insulating layer 20 is formed on a substrate 10 by a thermal oxidation.

Thereafter, a polysilicon 30 is deposited on the gate insulating layer 20. Then, a gate pattern (not shown) is formed using a photoresist film.

Afterwards, the polysilicon 30 is etched using the gate pattern as an etch mask so as to complete a formation of the gate 30 in the semiconductor device.

Meanwhile, as a modern semiconductor device becomes highly integrated and micronized, a critical dimension (CD) of the gate is also reduced proportionally. In particular, the performance of the semiconductor device depends on whether or not the critical dimension of the gate in nano-scale feature can be implemented in high technology semiconductors.

However, a variable to determine the critical dimension of the metal line in the related art mainly depends on the performance of a photolithographic apparatus.

Therefore, there is such a serious problem in the related art that the control of the critical dimension of the gate only depends on the performance limitation of the photolithographic apparatus utterly.

SUMMARY OF THE INVENTION

Accordingly, the present invention is directed to a method of forming fine patterns in a semiconductor device and a method of forming a gate using the same that substantially obviates one or more problems due to limitations and disadvantages of the related art.

An object of the present invention is to provide a method of forming fine patterns in a semiconductor device, and a method of forming a gate with a fine critical dimension using the same, in spite of using an existing photolithographic apparatus.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of forming fine patterns in a semiconductor device, the method including: forming a plurality of sidewall buffer patterns on a gate insulating layer formed on a substrate, wherein the plurality of the sidewall buffer patterns are spaced apart from each other by a predetermined distance; depositing a sidewall layer on the sidewall buffer patterns as well as the gate insulating layer; and etching the sidewall layer such that sidewall patterns remain on sidewalls of the sidewall buffer patterns.

In another aspect of the present invention, there is provided a method of forming a gate using the method of forming the fine patterns, the method including: forming a plurality of sidewall buffer patterns over a gate insulating layer formed on a substrate, wherein the plurality of the sidewall buffer patterns are spaced apart from each other by a predetermined distance; depositing a sidewall layer on the sidewall buffer patterns as well as the gate insulating layer; etching the sidewall layer such that sidewall patterns remain on sidewalls of the sidewall buffer patterns; depositing a conductive layer on the sidewall buffer patterns and the sidewall patterns as well as the gate insulating layer; and forming a gate by etching the sidewall buffer patterns and the sidewall patterns.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIRST EMBODIMENT

FIGS. 2A to 2D are cross-sectional views illustrating a method of forming fine patterns in a semiconductor device according to a first embodiment of the present invention.

The method of forming the fine patterns in the semiconductor device according to the first embodiment of the present invention may include: forming sidewall buffer patterns; depositing a sidewall layer; and etching the sidewall layer. At this time, the above respective operations and other operations which may be added to these operations, may be performed in alternate sequences thereof.

Figure 1:
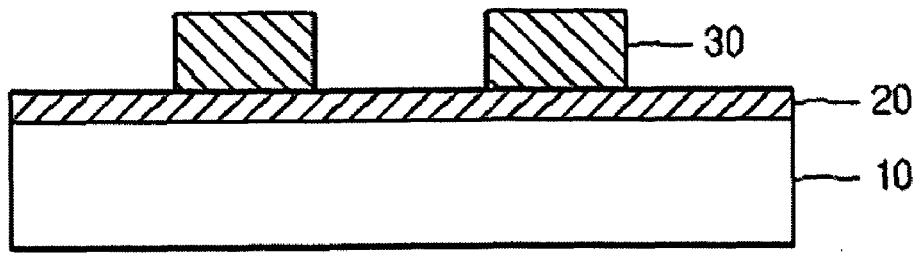
FIG. 1 is a cross-sectional view illustrating a related art method of forming a gate in a semiconductor device.
Figure 2A:
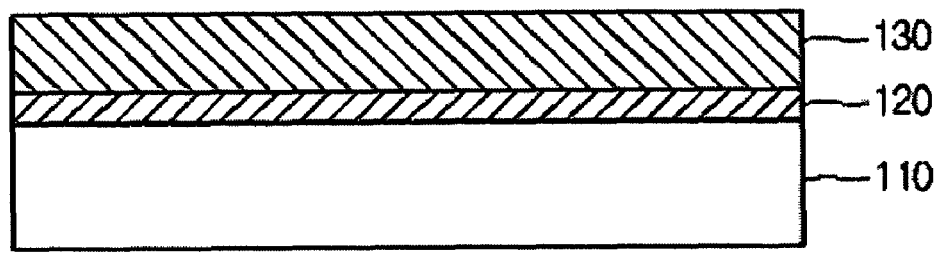
FIGS. 2A to 2D are cross-sectional views illustrating a method of forming fine patterns in a semiconductor device according to a first embodiment of the present invention.

First, referring to FIG. 2A, a sidewall buffer layer 130 is formed over a substrate 110 where a gate insulating layer 120 is formed.

For example, the gate insulating layer 120 such as a gate oxide layer is formed on the silicon substrate 110. Thereafter, the sidewall buffer layer 130 such as a nitride layer, an oxide layer or the like may be formed on the gate insulating layer 120. However, the gate insulating layer 120 and the sidewall buffer layer 130 may be formed differently according to other examples.

Figure 2B:
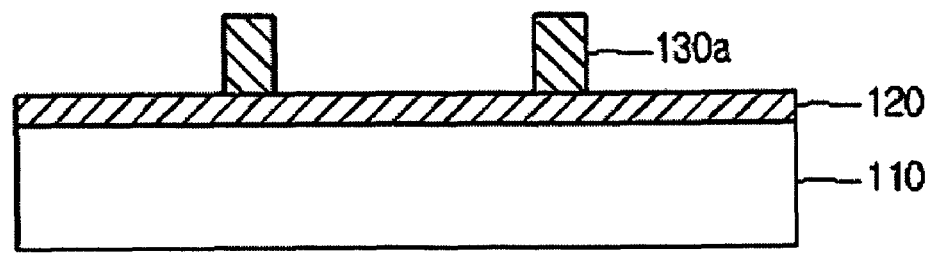

Afterwards, referring to FIG. 2B, a photoresist layer (not shown) is coated on the sidewall buffer layer 130 and it is patterned into a predetermined configuration. Subsequently, the sidewall buffer layer 130 is etched using the patterned photoresist layer as an etch mask, to thereby form a plurality of sidewall buffer patterns 130a which are spaced apart from each other by a predetermined distance.

At this time, the critical dimension (CD) of a gate is basically determined according to the predetermined distance between the plurality of the sidewall buffer patterns 130a. Afterwards, the critical dimension of the gate is ultimately determined according to the distance between sidewall patterns formed on sidewalls of the sidewall buffer patterns 130a. This will be illustrated more fully in detail later.

Figure 2C:
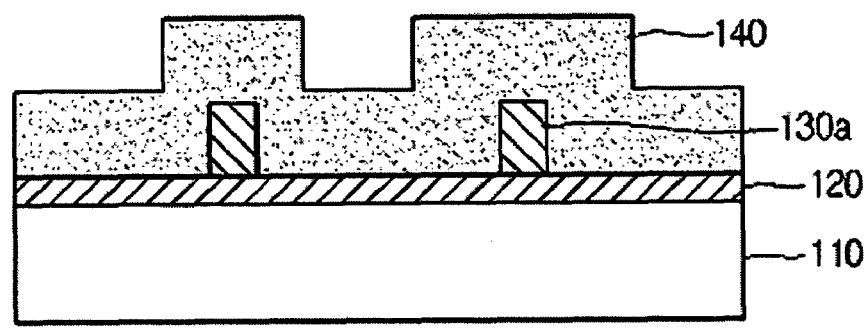

Next, referring to FIG. 2C, a sidewall layer 140 is deposited on the sidewall buffer patterns 130a as well as the gate insulating layer 120.

Meanwhile, the first embodiment of the present invention may further include an operation of planarizing the sidewall layer 140 after depositing the sidewall layer 140. The planarization may be performed using chemical mechanical polishing (CMP) or another method.

Figure 2D:
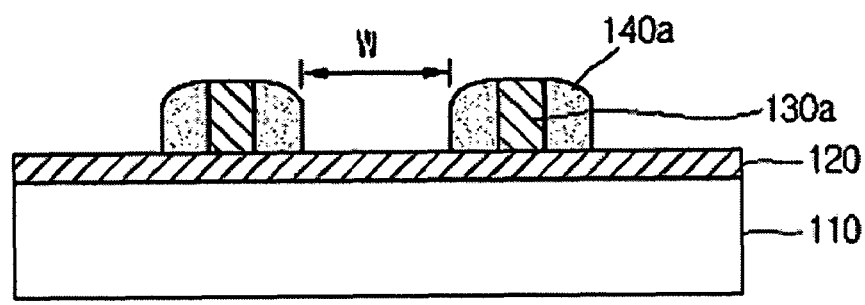

Afterwards, referring to FIG. 2D, the sidewall layer 140 is etched such that sidewall patterns 140a, i.e., portions of the sidewall layer 140, remain on sidewalls of the sidewall buffer patterns 130a.

The etching operation of the sidewall layer 140 is performed such that the distance W between the sidewall patterns 140a remaining on the sidewalls of the sidewall buffer patterns 130a maintains the critical dimension of the gate.

In particular, according to the first embodiment of the present invention, it is possible to control the critical dimension by means of the distance W between the sidewall patterns 140a because the width of the sidewall pattern 140a is determined according to the height of the sidewall buffer pattern 130a. That is, the critical dimension of the gate may be controlled by the width of the sidewall pattern 140a which is determined according to the height of the sidewall buffer pattern 130a.

For instance, as the sidewall buffer pattern 130a is higher and higher, the sidewall pattern 140a becomes wider and wider. Therefore, the distance between the sidewall patterns 140a is shortened to thereby obtain a gate pattern with a fine critical dimension. This is because the width of the sidewall pattern 140a becomes wider and wider as the sidewall buffer pattern 130a is higher and higher, and vice versa, as the sidewall buffer pattern 130a is lower and lower, the sidewall pattern 140a formed on the sidewalls of the sidewall buffer pattern 130a becomes narrower and narrower.

In conclusion, the critical dimension of the gate pattern may be controlled by the width of the sidewall pattern 140a according to the distance between the sidewall buffer patterns 130a and the height of the sidewall buffer pattern 130a.

According to the first embodiment of the present invention, the inventive method is effective for obtaining the gate patterns with the fine critical dimension, which cannot be achieved by the existing photolithographic apparatus according to the related art, by controlling the distance between the sidewall buffer patterns and the height of the sidewall buffer pattern, in spite of using the existing photolithographic apparatus.

SECOND EMBODIMENT

Figure 3A:
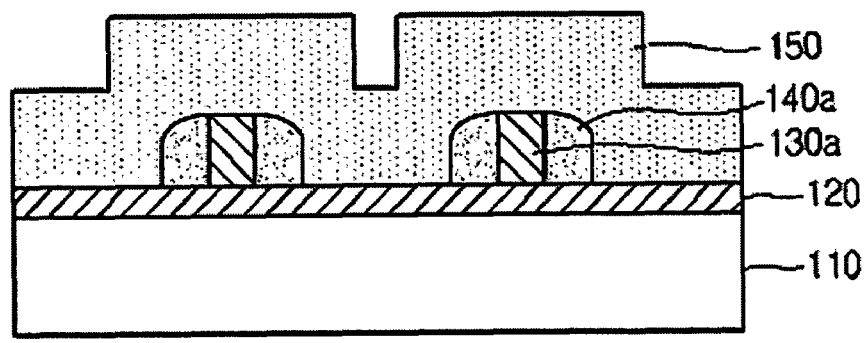
FIGS. 3A to 3C are cross-sectional views illustrating a method of forming a gate using the method of forming the fine patterns in the semiconductor device according to a second embodiment of the present invention.
Figure 3B:
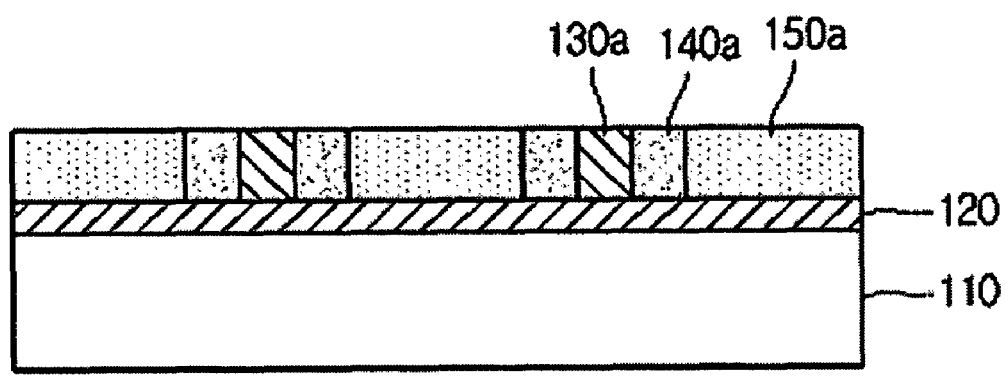
Figure 3C:
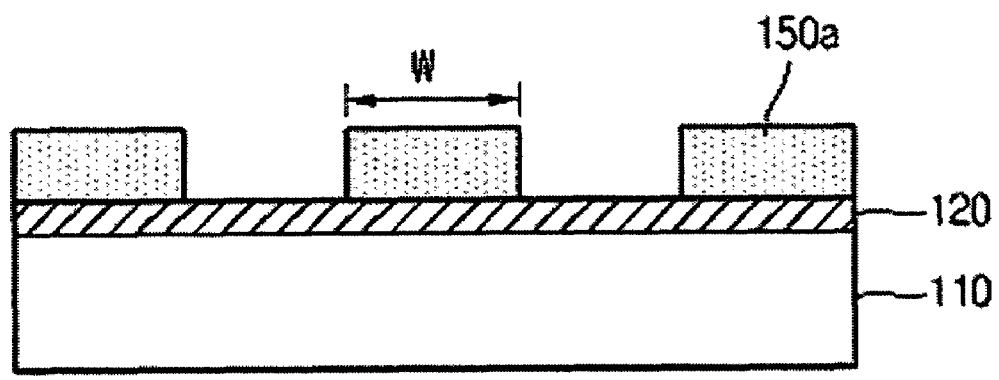

FIGS. 3A to 3C are cross-sectional views illustrating a method of forming a gate using the method of forming the fine patterns in the semiconductor device according to a second embodiment of the present invention.

The method of forming the gate using the method of forming the fine patterns in the semiconductor device according to the second embodiment of the present invention, may include: forming sidewall buffer patterns; depositing a sidewall layer; etching the sidewall layer; depositing a conductive layer; and forming a gate. At this time, the above respective operations and other operations which may be added to these operations, may be performed in alternate sequences thereof.

To begin with, the operation for forming the sidewall buffer patterns, the operation for depositing the sidewall layer, and the operation of etching the sidewall layer may be performed by employing the method of the first embodiment.

For example, the operation for etching the sidewall layer 140 may be performed such that the distance W between the sidewall patterns 140a on the sidewalls of the sidewall buffer patterns 130a maintains the critical dimension of the gate.

At this time, the sidewall buffer patterns 130a may be formed of a material which is more excellent in etch selectivity than a conductive layer which will be described later. For example, the sidewall buffer pattern 130a may be formed of an oxide material, a nitride material or other materials which are excellent in etch selectivity than the conductive layer.

Also, the sidewall pattern 140a may be formed of a material which is more excellent in etch selectivity than the conductive layer. For instance, the sidewall layer 140 may be formed of an oxide material, a nitride material or other materials which are excellent in etch selectivity than the conductive layer.

Thereafter, referring to FIG. 3A, the conductive layer 150 is deposited on the sidewall buffer pattern 130a and the sidewall pattern 140a as well as the gate insulating layer 120. Herein, the conductive layer 150 may be formed of polysilicon or another conductive material.

Furthermore, referring to FIG. 3B, the second embodiment of the present invention may further include an operation for planarizing the conductive layer 150 after depositing the conductive layer 150. The planarization may be performed using the CMP process or another planarizing method.

Afterwards, referring to FIG. 3C, the sidewall buffer patterns 130a and the sidewall patterns 140a are etched to thereby form a gate 150a. This etching operation may be performed using wet etching or dry etching.

In particular, according to the second embodiment of the present invention, it is possible to control the critical dimension of the gate by controlling the distance W between the sidewall patterns 140a as the width of the sidewall pattern 140a is determined according to the height of the sidewall buffer pattern 130a.

For instance, as the sidewall buffer pattern 130a is higher and higher, the sidewall pattern 140a becomes wider and wider. Therefore, the distance between the sidewall patterns 140a becomes shortened so as to obtain the gate with the fine critical dimension. This is because the width of the sidewall pattern 140a becomes wider and wider as the sidewall buffer pattern 130a is higher and higher, and vice versa, as the sidewall buffer pattern 130a is lower and lower, the sidewall pattern 140a formed on the sidewalls of the sidewall buffer pattern 130a becomes narrower and narrower.

In conclusion, the critical dimension of the gate may be controlled by the width of the sidewall pattern 140a which is determined according to the distance between the sidewall buffer patterns 130a and the height of the sidewall buffer pattern 130a.

According to the method of forming the gate using the method of forming the fine patterns in the semiconductor device in accordance with the second embodiment of the present invention, it is effective for improving the performance of the semiconductor device by forming the gate with fine critical dimension, which cannot be achieved by the existing photolithographic apparatus according to the related art.

In addition, even if a new photolithographic apparatus will be developed on and on in the near future, it is possible to form the gate with the fine critical dimension by overcoming limits of the new photolithographic apparatus.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a gate, the method comprising:
   forming a plurality of sidewall buffer patterns over a gate insulating layer formed on a substrate, wherein the plurality of sidewall buffer patterns are spaced apart from each other by a predetermined distance;
   depositing a sidewall layer on the sidewall buffer patterns and directly on the gate insulating layer;
   etching the sidewall layer such that sidewall patterns remain on sidewalls of the sidewall buffer patterns, wherein during the step of etching the sidewall layer, a critical dimension (CD) of a gate pattern is determined by a distance between the sidewall patterns, wherein the distance between the sidewall patterns is determined by both a width of a sidewall pattern of the sidewall patterns and a height of a sidewall buffer pattern of the sidewall buffer patterns;
   forming a gate by depositing a conductive layer on the gate insulating layer between the sidewall patterns; and
   etching all the sidewall buffer patterns and the sidewall patterns,
   wherein the sidewall buffer patterns are formed of a first insulator and the sidewall layer is formed of a second insulator, and
   wherein the gate insulating layer remains after etching the sidewall buffer patterns and the sidewall patterns.

2. The method according to claim 1, wherein the step of forming the plurality of sidewall buffer patterns includes:
   depositing a sidewall buffer layer over the gate insulating layer formed on the substrate;
   patterning a photoresist layer after coating the photoresist layer on the sidewall buffer layer; and
   etching the sidewall buffer layer using the patterned photoresist layer as an etch mask.

3. The method according to claim 1, wherein, during the step of forming the plurality of sidewall buffer patterns, the sidewall buffer pattern is formed of a material having superior etch selectivity to the etch selectivity of the conductive layer.

4. The method according to claim 1, wherein, during the step of forming the plurality of sidewall buffer patterns, the sidewall buffer pattern is formed of one of an oxide material and a nitride material.

5. The method according to claim 1, wherein, during the step of depositing the sidewall layer, the sidewall pattern is formed of a material with superior etch selectivity than the conductive layer.

6. The method according to claim 1, wherein, during the step of depositing the sidewall layer, the sidewall pattern is formed of one of an oxide material and a nitride material.

7. The method according to claim 1, further comprising, after the step of depositing the sidewall layer, planarizing the sidewall layer.

8. The method according to claim 1, wherein, during the step of etching the sidewall layer, the sidewall layer is etched such that the distance between the sidewall patterns remaining on the sidewalls of the sidewall buffer patterns maintains the critical dimension (CD) of a gate.

9. The method according to claim 1, wherein, during the step of etching the sidewall layer, the distance between the sidewall patterns is shortened to be a critical dimension of a fine gate as the sidewall pattern becomes wide with the increase of the height of the sidewall buffer pattern.

10. The method according to claim 1, further comprising, after the step of depositing the conductive layer, planarizing the conductive layer.

* * * * *